United States Patent [19]
Chen et al.

[11] Patent Number: 6,077,733
[45] Date of Patent: Jun. 20, 2000

[54] METHOD OF MANUFACTURING SELF-ALIGNED T-SHAPED GATE THROUGH DUAL DAMASCENE

[75] Inventors: Yen-Ming Chen, Hsinchu; Wei-Jen Liu, Hsin-Chu; Shih-Chi Lin, Taipei; Kuo-Chou Liu, Hsin Chu, all of Taiwan

[73] Assignee: Taiwan Semiconductor Manufacturing Company, Hsin-Chu, Taiwan

[21] Appl. No.: 09/389,885

[22] Filed: Sep. 3, 1999

[51] Int. Cl.$^7$ .................................................. H01L 21/338
[52] U.S. Cl. .......................... 438/182; 438/197; 438/303; 438/585; 438/595
[58] Field of Search ..................... 438/182, 197, 438/303, 585, 595

[56] References Cited

U.S. PATENT DOCUMENTS

| | | | |
|---|---|---|---|
| 4,341,850 | 7/1982 | Coane | 430/11 |
| 4,700,462 | 10/1987 | Beaubien | 437/187 |
| 5,498,560 | 3/1996 | Sharma et al. | 437/43 |
| 5,543,253 | 8/1996 | Park et al. | 439/5 |
| 5,614,765 | 3/1997 | Avanzino et al. | 257/774 |
| 5,688,704 | 11/1997 | Liu | 437/41 |
| 5,689,140 | 11/1997 | Shoda | 257/774 |
| 5,861,327 | 1/1999 | Maeng | 438/167 |
| 5,861,347 | 1/1999 | Maiti | 438/787 |

*Primary Examiner*—Charles Bowers
*Assistant Examiner*—Matthew Whipple
*Attorney, Agent, or Firm*—George O. Saile; Stephen B. Ackerman

[57] ABSTRACT

A new method is provided to manufacture a T-shaped gate. A layer of insulation is deposited over a semiconductor surface (typically the surface of a substrate), a dual damascene structure containing a via opening and a conducting line trench is created in the layer of insulation. A layer of sacrificial oxide is grown and subsequently removed (preventing initial surface defects and providing protection during subsequent steps of etching). A layer of gate oxide is selectively grown on the bottom of the dual damascene opening. A layer of poly is deposited over the layer of insulation thereby including the dual damascene opening, the poly is planarized down to essentially the top of the dual damascene structure and the insulation is removed from above the surface of the substrate in the regions surrounding the dual damascene structure leaving the dual damascene structure in place.

10 Claims, 5 Drawing Sheets

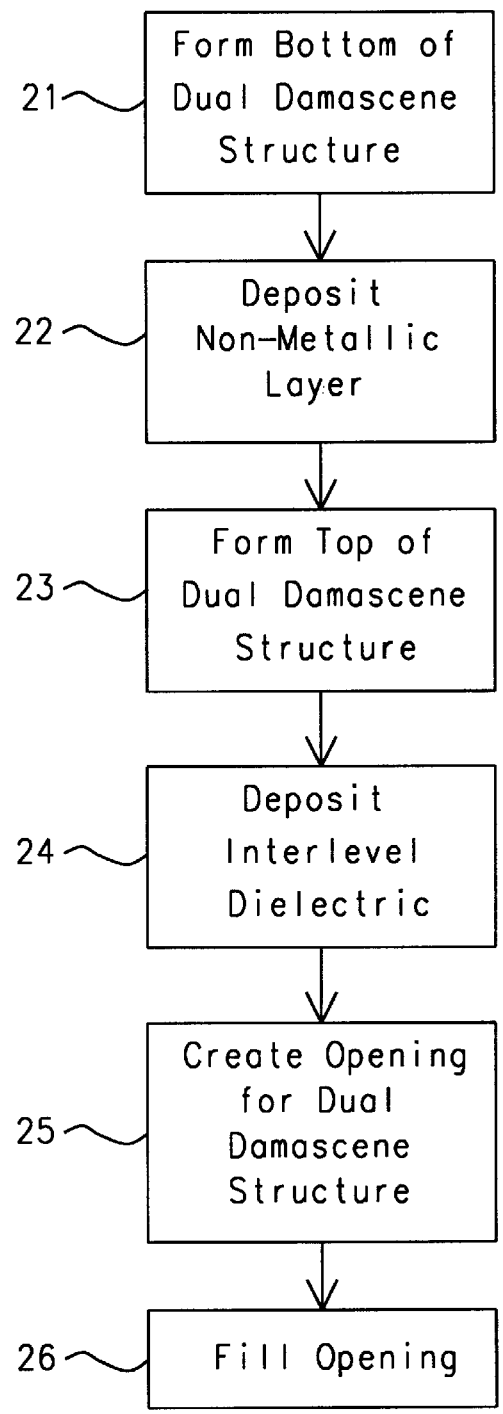
FIG. 1a – Prior Art

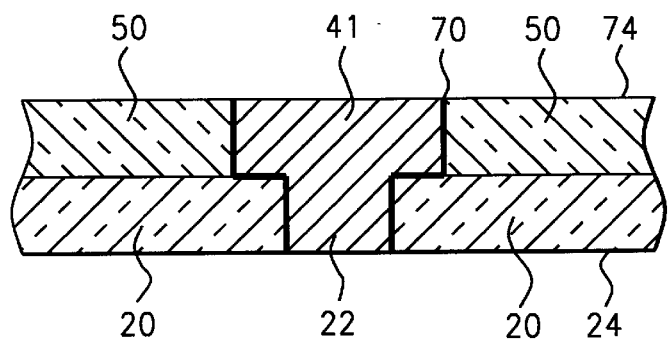
FIG. 1b – Prior Art
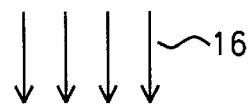
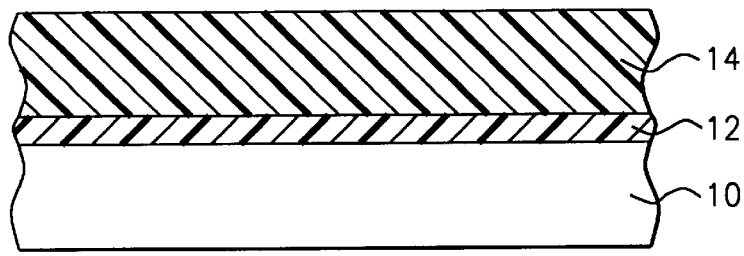
FIG. 2a – Prior Art
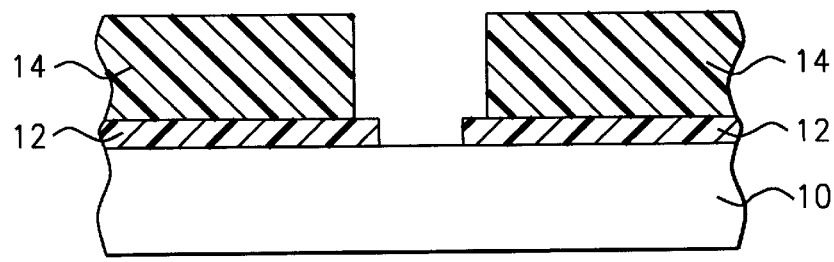
FIG. 2b – Prior Art

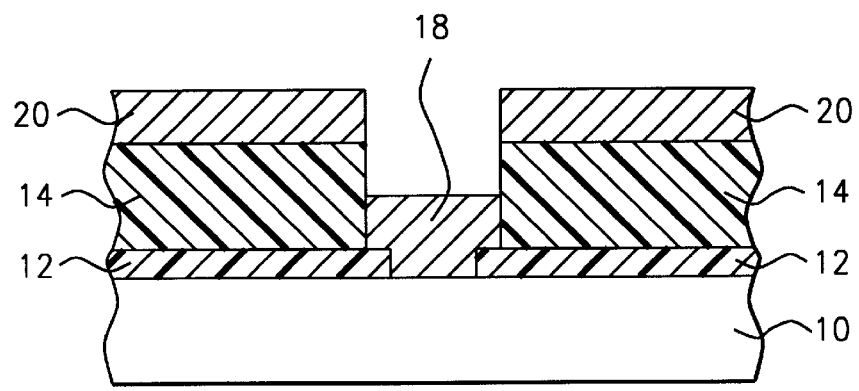
FIG. 2c - Prior Art
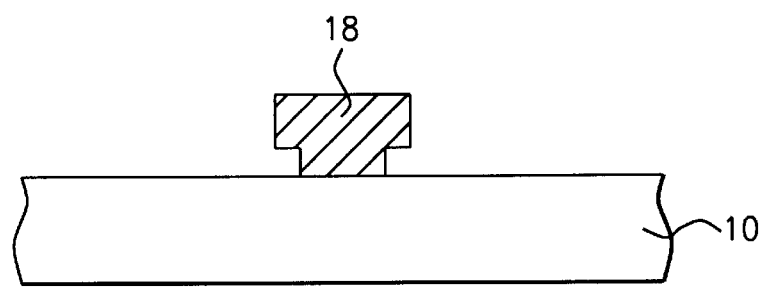
FIG. 2d - Prior Art
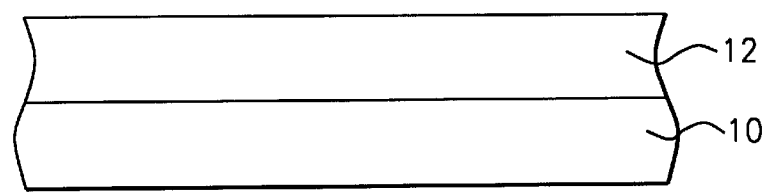
FIG. 3a

METHOD OF MANUFACTURING SELF-ALIGNED T-SHAPED GATE THROUGH DUAL DAMASCENE

BACKGROUND OF THE INVENTION (1) Field of the Invention

The invention relates to the fabrication of integrated circuit devices, and more particularly, to a method of forming a self-aligned dual damascene structure.

(2) Description of the Prior Art

The manufacturing of semiconductor devices requires the application of multiple diverse technical disciplines that collectively enable the continuing advancements of device performance that has been accomplished ever since the initiation of the semiconductor device. These various disciplines address various aspects of the device creation whereby typically a plurality of active circuits is created in a semiconductor substrate. To create a collection of circuits, commonly referred to as Integrated Circuits (IC's), the individual circuits are interconnected with metal leads. To further increase device density, multiple layers of interconnect metal can be created. These multiole layers of interconnect metal are separated by layers of dielectric or by insulating layers. Adjacent layers of metal lines are interconnected by means of metal contact plugs or vias.

The semiconductor industry has, over the last several decades, been driven by a continued striving to improve device performance, which requires a continued decrease of semiconductor device feature size. In present day semiconductor devices, it is not uncommon to encounter feature size in the deep sub-micron range. With this decrease in device feature size, sub-micron metal interconnects become increasingly more important. A number of different approaches are used in the art for the formation of patterns of interconnect lines, most of these approaches start with the deposition of a patterned layer of dielectric where the pattern in the dielectric forms contact openings between overlying metal and underlying points of electrical contact. A layer of metal is deposited over the layer of dielectric and patterned in accordance with the required pattern of interconnect lines whereby the interconnect lines, where required, align with the underlying contact openings. The patterning of the layer of metal requires the deposition of a layer of photoresist over the layer of metal, the photoresist is exposed typically using photolithographic techniques and etched, typically using a dry etch process. The patterned layer of photoresist is removed after the interconnect metal line pattern has been created leaving the interconnect line pattern in place. For sub-micron metal line sizes, these highlighted processing steps encounter a number of problems that are typical of device sub-miniaturization. These problems are problems of poor step coverage of the deposited metal (the metal should be evenly deposited and should fill the profile for the metal line with equal metal density), problems of etching (using dry etching but metal such as copper and gold are difficult to plasma etch) and problems of step coverage and planarization for the overlying layer of dielectric.

In the formation of semiconductor integrated circuits, it is common practice to form interconnect metal line structures on a number of different levels within the structure and interconnecting the various levels of wiring with contact or via openings. The first or lowest level of interconnect wires is typically formed as a first step in the process after which a second or overlying level of interconnect wires is deposited over the first level. The first level of interconnect wires is typically in contact with active regions in a semiconductor substrate but is not limited to such contacts. The first level of interconnect can for instance also be in contact with a conductor that leads to other devices that form part of a larger, multi-chip structure. The two levels of metal wires are connected by openings between the two layers, these openings are filled with metal whereby the openings between the two metal layers are lined up with and match contact points in one or both of the levels of metal lines.

The brief description of the process of metalization that has been given above has been described with reference to the damascene and dual damascene processes which form two widely used approaches in creating metal interconnects. The application of the Damascene process continues to gain wider acceptance, most notably in the process of copper metalization due to the difficulty of copper dry etch where the damascene plug penetrates deep in very small, sub-half micron, Ultra Large Scale Integrated (ULSI) devices. Recent applications have successfully used copper as a conducting metal line, most notably in the construct of CMOS 6-layer copper metal devices.

With increasing device densities, the area that is available for circuit wiring becomes relatively more important as a potential limiting factor in device performance. This has led to the development of multi-layer wiring where the dual damascene structure has found wide use.

For the creation of the single damascene structure, vias only are created. For the creation of the dual damascene, vias are created and conductors are created above the vias. For the dual damascene, special etch procedures can be used to form both the vias and the conductor patterns in the dielectric layer before the deposition of metal and the metal CMP. A thin etch stop layer can be used for this purpose between two layers of dielectric $SiO_2$.

With the damascene process a metal via plug is first formed in a surface, typically the surface of a semiconductor substrate. A layer of dielectric (for instance $SiO_2$) is deposited over the surface (using for instance PECVD technology); trenches (for metal lines) are formed in the dielectric (using for instance RIE technology). Metal is deposited to fill the trenches; the excess metal on the surface is removed. A planar structure of interconnect lines with metal inlays in the (intra-level) dielectric is achieved in this manner.

For the dual damascene process, the processing steps can follow three approaches.

Approach 1, the via is created first. The vias are formed by resist patterning after which an etch through the triple layer dielectric stack is performed. This is followed by patterning the conductor in the top layer of $SiO_2$ thereby using the SiN as an etch stop layer.

Approach 2. The conductor first process. The conductor patterns is formed by resist patterning and by etching the conductor patterns into the first $SiO_2$ layer thereby using the SiN layer as an etch stop layer. This is followed by via resist patterning and etching through the thin layer of SiN and the second $SiO_2$ layer.

Approach 3. Etch stop layer first. The first $SiO_2$ layer is deposited, followed by the thin layer of SiN as etch stop, followed by the via resist patterning and etching of the SiN layer. This is followed by depositing the top $SiO_2$ layer and then the conductor patterning. In etching the conductor pattern in the top $SiO_2$ layer, the etching process will be stopped by the SiN layer except where the via holes are already opened in the SiN layer thereby completing the via holes etching in the first $SiO_2$ layer simultaneously.

FIGS. 1*a* and 1*b* further detail the above.

FIG. 1a gives and overview of the sequence of steps required of forming a Prior Art dual Damascene structure. The numbers referred to in the following description of the formation of the dual Damascene structure relate to the cross section of the completed dual Damascene structure that is shown in FIG. 1b.

FIG. 1a, 21 shows the creation of the bottom part of the dual Damascene structure by forming a via pattern 22 on a surface 24, this surface 24 can be a semiconductor wafer but is not limited to such. The via pattern 22 is created in the plane of a dielectric layer 20 and forms the lower part of the dual Damascene structure. $SiO_2$ can be used for this dielectric.

FIG. 1a, 22 shows the deposition within plane 30 (FIG. 1b) of a layer of non-metallic material such as poly-silicon on top of the first dielectric 20 and across the vias 22, filling the via openings 22.

FIG. 1a, 23 shows the formation of the top section 41 of the dual Damascene structure by forming a pattern 41 within the plane of the non-metallic layer 30. This pattern 41 mates with the pattern of the previously formed vias 22 (FIG. 1a, 21) but it will he noted that the cross section of the pattern openings 41 within the plane 30 of the non-metallic layer is considerably larger than the cross section of the via openings 22 (FIG. 1a, 21). After pattern 41 has been created and as part of this pattern creation step, the remainder of the non-metallic layer 30 is removed, the pattern 41 remains at this time.

FIG. 1a, 24 shows the deposition and planarization (down to the top surface of pattern 41) of an intra level dielectric (ILD) 50, a poly-silicon can be used for this dielectric.

FIG. 1a, 25 shows the creation of an opening by removing the poly-silicon from the pattern 41 and the vias 22. It is apparent that this opening now has the shape of a T and that the sidewalls of the opening are not straight but show a top section that is larger than the bottom section.

FIG. 1a, 26 shows the cross-section of the dual damascene structure where a barrier 70 has been formed on the sides of the created opening. The opening, which has previously been created by removing the poly-silicon from the pattern 41 and the vias 22, has been filled with a metal. Metal such as Wolfram or copper can be used for this latter processing step.

U.S. Pat. No. 5,543,253 highlights another Prior Art method of forming a T-shaped gate structure, in this case using electron beam lithography. This method will be briefly highlighted her for completeness and with reference to FIG. 2. The process starts with the deposition of two layers of positive photoresist, a lower layer 12 of PMMA resist and a upper layer 14 of MMA resist, over the surface of a substrate 10, see FIG. 2a. The two layers of photoresist are exposed (16, FIG. 2a) by an electron beam in a predetermined pattern. The two layers of photoresist are developed and removed in accordance with the pattern of e-beam exposure, see FIG. 2b. The sensitivity of the two layers of photoresist to the e-beam exposure is selected such that the opening that is created resembles essentially the opening of a dual damascene structure. By blanket depositing a layer 20 (FIG. 2c) of metal over the surface of the upper layer 14 of photoresist and the bottom (18) of the created dual damascene opening and by subsequently removing the resist patterns 12 and 14 together with the layer 20 of deposited metal, the T-shaped dual damascene structure as shown in FIG. 2e is created. This method presents a number of problems such as being time consuming due to the relatively slow e-beam exposure process, diffusion of the deposited metal into the underlying layers of photoresist due to the high temperatures that are required for the metal deposition process and difficulties experienced in integrating an e-beam lithography process with the more conventional optical steppers that are typically used for other device processing steps within a device manufacturing environment.

The invention addresses the above indicated problems of dual damascene creation in addition to the problem of relatively increased parasitic gate resistance that occurs due to shrinking device dimensions for the conventional gate structure. This increased parasitic device resistance can rapidly decrease the device high-speed performance. For the conventional titanium silicide process that is applied in the creation of T-shaped gates to establish electrical contacts, the $TiSi_2$ that is used for the silicide creation must readily transfer from the high-resistance C49 structure to the (low resistance) C54 structure, even in an environment where the created silicide line width is below grain size. This problem is also addressed by the invention while the invention further prevents the agglomeration (the action or process of collecting in a mass) of silicide grains. This agglomeration is particularly prone to occur during subsequent processing steps of (high temperature) anneal.

U.S. Pat. No. 5,543,253 (Park et al.) teaches a method for a T-shaped gate using Dual damascene photoresist lift off process. Overall, this patent is close to the invention.

U.S. Pat. No. 5,689,140 (Shoda) discloses a modified dual damascene process to form contacts.

U.S. Pat. No. 5,614,765 (Avanzino et al.) teaches a dual damascene process.

U.S. Pat. No. 5,498,560 (Sharma et al.) discloses a self-aligned T-shaped gate process.

SUMMARY OF THE INVENTION

A principle objective of the invention is to reduce the parasitic resistance for a T-shaped gate structure of sharply reduced dimensions.

Another objective of the invention is to improve high-speed device performance for devices that use T-shaped gate structures of sharply reduced dimensions.

Yet another objective of the invention is to reduce the sheet resistance of silicide gate contacts by assuring the transfer during the conventional titanium silicide process of high-resistance (C49 phase) $TiSi_2$ to low-resistance (C54 phase) $TiSi_2$ for T-shaped gate structures of sharply reduced contact line width.

In accordance with the objectives of the invention a new method is provided to manufacture a T-shaped gate. A layer of insulation is deposited over a semiconductor surface (typically the surface of a substrate), a dual damascene structure containing a via opening and a conducting line trench is created in the layer of insulation. A layer of sacrificial oxide is grown and subsequently removed (preventing initial surface defects and providing protection during subsequent steps of etching); a layer of gate oxide is selectively grown on the bottom of the dual damascene opening. A layer of poly is deposited over the layer of insulation thereby including the dual damascene opening, the poly is planarized down to essentially the top of the dual damascene structure and the insulation is removed from above the surface of the substrate in the regions surrounding the dual damascene structure leaving the dual damascene structure in place.

BRIEF DESCRIPTION OF THE DRAWINGS

FIGS. 1a–1b shows a Prior Art process of forming a dual damascene structure.

FIGS. 2a–2d shows another Prior Art process of forming a dual damascene structure.

FIG. 3 shows the process of the invention for the formation of a T-shaped gate or dual damascene structure, as follows:

FIG. 3a shows a cross section of the semiconductor surface over which an insulating layer has been deposited.

DESCRIPTION OF THE PREFERRED EMBODIMENTS

Referring now specifically to FIG. 3a, there is shown a cross section of the semiconductor surface 10 over which an insulating layer 12 has been deposited.

Typical materials that can be used for the insulating layer are nitride or oxide, silicon dioxide ($SiO_2$), silicon nitride ($Si_3N_4$), (SiN), siliconoxynitride ($SiO_xN_y$), fluonated silicon oxide ($SiO_xF_y$). An insulating layer, such as silicon nitride ($Si_3N_4$), can be deposited using LPCVD using a reactant gas mixture such as dichlorosilane ($SiCl_2H_2$) and amonia ($NH_3$), typically deposited to a thickness of between 50 and 400 angstrom. Insulating layers can further contain borophosphosilicate glass (BPSG), deposited by LPCVD, using tetraetho-siloxane (TEOS) as the reactant gas. The above indicated materials and method used are not meant as an all-inclusive listing of materials and methods that are available but serve at this point merely as examples. For the process of the invention, the insulating layer is deposited to a thickness of between 5000 and 10000 angstrom so as to enable the construction of the dual damascene structure within the thickness of the insulating layer.

The preferred processing conditions for the deposition of layer 12 of insulating material are as follows: source: TEOS, flow rate between about 80 and 100 sccm, temperature between about 680 and 730 degrees C., pressure between about 240 and 260 mTorr, processing chamber used: an LP system, time of deposition about 60 minutes.

Figure 3B:
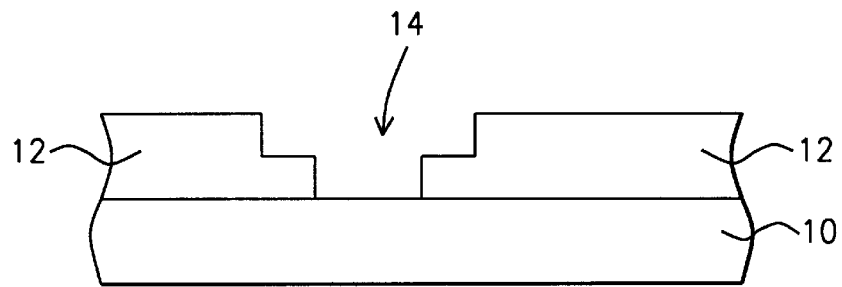
FIG. 3b shows a cross section after the dual damascene structure has been created in the insulating layer.

FIG. 3b shows a cross section after the dual damascene structure 14 has been created in the insulating layer 12. This dual damascene structure has been created by exposure using lithography and subsequent etching of the insulating layer 12. Insulating layers can be anisotropically etched with a plasma gas containing carbon tetrofluoride ($CF_4$) as an etchant using a commercially available parallel plate RIE etcher or an Electron Cyclotron Resonance (ECR) plasma reactor.

The preferred processing conditions for the etching of insulating layer 12 are as follows: etchant used: $CF_4/CHF_3$, flow rate about 25 sccm, temperature about 40 degrees C., pressure about 225 mTorr, time of the etch between about 160 and 220 seconds.

Figure 3C:
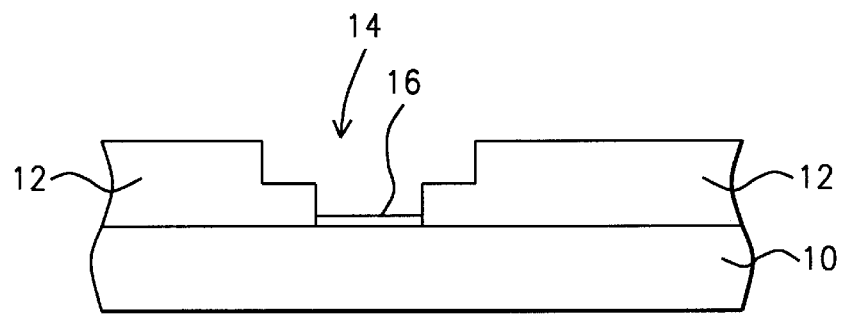
FIG. 3c shows a cross section of the dual damascene structure after the growth of the sacrificial oxide.

FIG. 3c shows a cross section of the dual damascene structure 14 after the growth of the sacrificial oxide 16. This layer of sacrificial oxide is only temporarily applied and is removed after it has been grown. The layer of sacrificial oxide can be formed by thermal oxidation of the underlying silicon and can also be formed in conjunction with a deposited oxide layer, nitride layer or any other suitable material. For the layer of sacrificial oxide material such as $SiO_2$ can be used. Also can be used TEOS (tetraethosiloxane), Plasma Enhanced TEOS (PETEOS), boron phosphate silicate glass (BPSG). The layer of sacrificial oxide can be grown in a low power furnace using LPCVD or PECVD or APCVD procedures at a temperature within the range between 300 and 800 degrees C. for a time period within the range between 30 and 60 minutes to a thickness of between 50 and 100 Angstrom.

The preferred processing conditions for the growing of layer 16 of sacrificial oxide are as follows: source: wet $O_2$, flow rate for the $O_2$ is about 0 to 10 sccm, flow rate for the $H_2$ is about 15 slpm, temperature of about 875 degrees C., under atmospheric pressure, time of about 30 minutes, a furnace is used due to the thermal oxide.

Typically, oxides can be etched using $Ar/CF_4$ as an etchant at a temperature of between about 120 and 160 degrees C. and a pressure of between about 0.30 and 0.40 Torr for a time of between about 33 and 39 seconds using a dry etch process.

The preferred processing conditions for the etching of layer 16 of sacrificial oxide are as follows: wet dip or HF pure vapor are preferred, time for the wet dip is about 30 seconds, the HF vapor uses pure HF with a ratio of $H_2O$:HF= 2:1 applied for a time between about 1 and 2 seconds.

Figure 3D:
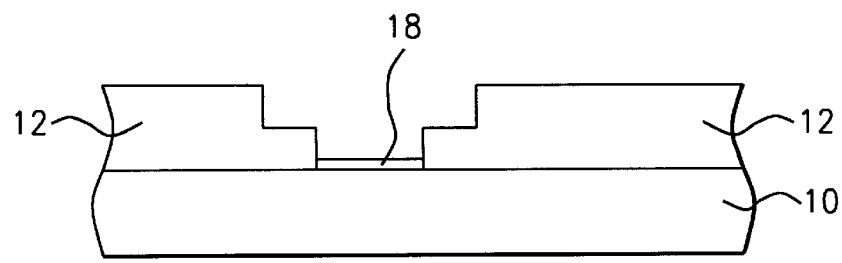
FIG. 3d shows a cross section of the dual damascene structure after the growth of the gate oxide on the bottom of the dual damascene structure.

FIG. 3d shows a cross section of the dual damascene structure after the growth of the gate oxide 18 on the bottom of the dual damascene structure. Gate oxide 18 is usually formed as a silicon dioxide material but may be a composite oxide, such as TEOS and silicon dioxide, or a nitride oxide layer or a like gate dielectric. In the application at hand and shown in FIG. 3d, the gate oxide layer is grown in an oxidation steam ambient at a temperature between about 850 and 1000 degrees C. to a thickness between about 50 and 250 Angstrom.

Figure 3E:
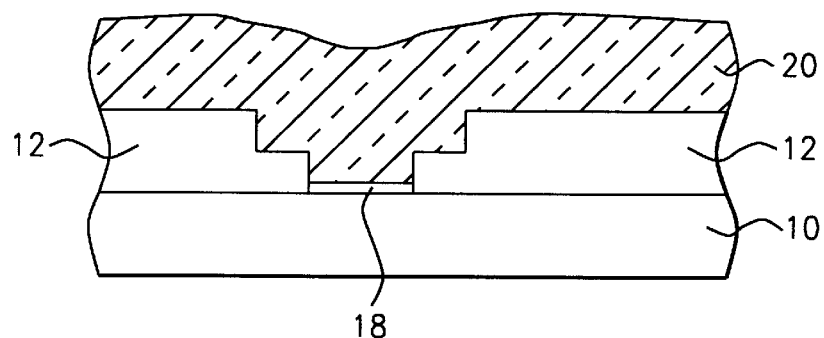
FIG. 3e shows a cross section of the dual damascene structure after the deposition of a layer of polysilicon.

FIG. 3e shows a cross section of the dual damascene structure after the deposition of a layer of polysilicon. The layer 20 of gate polysilicon can be in situ doped poly deposited using LPCVD at a temperature between about 500 and 700 degrees C. to a thickness between about 4000 and 10000 angstrom, using silane as a source and with the addition of phosphine to provide the needed dopant.

Figure 3F:
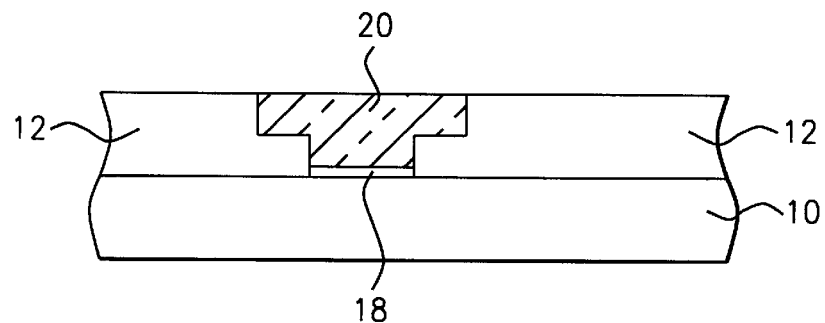
FIG. 3f shows a cross section of the dual damascene structure after the planarization of the deposited layer of polysilicon.

FIG. 3f shows a cross section of the dual damascene structure after the planarization of the deposited layer of polysilicon. The planarization of the polysilicon layer 20 is performed using CMP techniques and proceeds to essentially the top surface of the insulating layer 12.

Figure 3G:
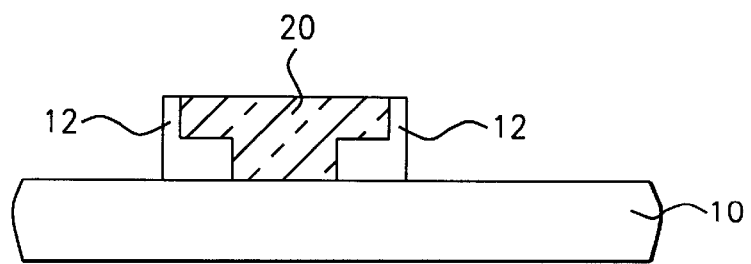
FIG. 3g shows a cross section of the dual damascene structure after the removal of the insulation layer.

FIG. 3g shows a cross section of the dual damascene structure after the removal of the insulation layer. The insulating layer 12 has been removed, as shown in FIG. 3g, from the area that surrounds the T-gate structure leaving the T-gate structure essentially in place. Insulating layer 12 can be anisotropically etched using carbon tetrofluoride ($CF_4$) is an etchant gas using a commercially available parallel plate RIE etcher or an Electron Cyclotron Resonance (ECR) plasma reactor.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a T-shaped gate structure on the surface of a semiconductor substrate, comprising the steps of:

provising a semiconductor substrate;

depositing a layer of insulating material over the surface of said substrate;

creating a trench in said insulating layer whereby said trench has the profile of a dual damascene structure;

temporarily applying a layer of sacrificial oxide over the surface of said dual damascene trench thereby including the surface of the surrounding substrate;

growing a layer of gate oxide at the bottom of said dual damascene trench;

depositing a layer of in-situ doped polysilicon inside said dual damascene trench thereby including the surface of the surrounding layer of insulation;

planarizing the surface of said layer of doped polysilicon essentially down to the top surface of said insulating layer; and removing said insulating layer from above the surface of said substrate and adjacent to said dual damascene structure thereby leaving said dual damascene structure in place, whereby a portion of the insulating layer remains along the entire vertical sidewalls of said dual damascene structure.

2. The method of claim 1 wherein said depositing a layer of insulating material over the surface of said substrate is depositing a layer of a material that is selected from the group containing nitride or oxide, silicon dioxide ($SiO_2$), silicon nitride ($Si_3N_4$), (SiN), siliconoxynitride ($SiO_xN_y$), or fluorinated silicon oxide ($SiO_xF_y$) said deposition using LPCVD, PECVD, or APCVD processing, at a temperature between about 400 to 800 degrees C. to a thickness between about 5000 to 10000 Angstrom.

3. The method of claim 1 wherein said creating a trench in said insulating layer is a process of photolithographic exposure of the surface of said layer of insulating material followed by an anisotrophcally etch of said layer of insulating material with a plasma gas containing carbon tetrofluoride ($CF_4$) as an etchant using a commercially available parallel plate RIE etcher or an Electron Cyclotron Resonance (ECR) plasma reactor.

4. The method of claim 1 wherein said temporarily applying a layer of sacrificial oxide is:

a thermal oxidation of the underlying silicon in a low power furnace using LPCVD or PECVD or APCVD procedures at a temperature within the range between 300 and 900 degrees C. for a time period within the range between 30 and 60 minutes to a thickness of between 50 and 200 Angstrom; and removing said layer of sacrificial oxide by etching at a temperature of between about 120 and 160 degrees C. and a pressure of between about 0.30 and 0.40 Torr for a time of between about 33 and 39 seconds using a dry etch process.

5. The method of claim 1 wherein said temporarily applying a layer of sacrificial oxide is:

depositing a layer of material selected from the group containing an oxide or a nitride or TEOS (tetraethosiloxane), Plasma Enhanced TEOS (PETEOS), boron phosphate silicate glass (BPSG) or a preferred method using thermal oxide applied in a steam ambient; and removing said layer of sacrificial oxide by etching at a temperature of between about 120 and 160 degrees C. and a pressure of between about 0.30 and 0.40 Torr for a time of between about 33 and 39 seconds using a dry etch process.

6. The method of claim 1 wherein said growing a layer of gate oxide at the bottom of said dual damascene trench is using a silicon dioxide or a composite oxide or a nitride oxide or a like gate dielectric grown in an oxidation steam ambient at a temperature between about 850 and 1000 degrees C. to a thickness between about 50 and 250 Angstrom.

7. The method of claim 1 wherein said depositing a layer of in situ doped polysilicon inside said dual damascene trench is depositing an in situ doped poly using LPCVD at a temperature between about 500 and 700 degrees C. to a thickness between about 4000 and 10000 angstrom, using silane as a source and with the addition of phosphine to provide the needed dopant.

8. The method of claim 1 wherein said planarizing the surface of said layer of doped polysilicon is a CMP process whereby said planarization is to proceed to essentially at or slightly below the surface of said layer of insulating material.

9. The method of claim 1 wherein said removing said insulating layer from above the surface of said substrate and adjacent to said dual damascene structure is an anisotropically etch using carbon tetrofluoride ($CF_4$) is an etchant gas using a commercially available parallel plate RIE etcher or an Electron Cyclotron Resonance (ECR) plasma reactor.

10. A method of forming a T-shaped gate structure on the surface of a semiconductor substrate, comprising the steps of:

providing a semiconductor substrate;

depositing a layer of insulating material over the surface of said substrate using LPCVD, PECVD, or APCVD processing, at a temperature between about 400 to 800 degrees C. to a thickness between about 5000 to 10000 Angstrom;

creating a trench in said insulating layer whereby said trench has the profile of a dual damascene structure by photolithographic exposure of said insulating layer followed by applying an anisotropically etch with a plasma gas to the surface of said layer of insulating material;

temporarily applying a layer of sacrificial oxide by using a thermal oxidation of the underlying silicon or by a deposition of a suitable layer of material thereafter removing said layer of sacrificial oxide by etching;

selectively growing a layer of gate oxide at the bottom of said dual damascene trench;

depositing a layer of in-situ doped polysilicon inside said dual damascene trench thereby including the surface of the surrounding layer of insulating material using LPCVD at a temperature between about 500 and 700 degrees C. to a thickness between about 4000 and 10000 angstrom, using silane as a source and with the addition of phosphine to provide the needed dopant;

planarizing the surface of said layer of doped polysilicon using a CMP process whereby said planarization is to proceed to essentially at or slightly below the surface of said layer of insulating material; and removing said insulating layer from above the surface of said substrate and adjacent to said dual damascene structure by performing an anisotropically etch of said insulating layer thereby leaving said dual damascene structure in place, whereby a portion of the insulating layer remains along the entire vertical sidewalls of said dual damascene structure.

* * * * *